US012782450B2

(12) United States Patent
Baek et al.

(10) Patent No.: US 12,782,450 B2
(45) Date of Patent: Nov. 3, 2026

(54) BATTERY DIAGNOSTIC DEVICE AND METHOD THEREOF

(71) Applicants: Hyundai Motor Company, Seoul (KR); Kia Corporation, Seoul (KR)

(72) Inventors: Yo Han Baek, Anyang-si (KR); Hyo Kyung Lee, Anyang-si (KR); Bo Hyun Lee, Incheon (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 210 days.

(21) Appl. No.: 18/734,305

(22) Filed: Jun. 5, 2024

(65) Prior Publication Data

US 2025/0155512 A1 May 15, 2025

(30) Foreign Application Priority Data

Nov. 13, 2023 (KR) ........................ 10-2023-0156610

(51) Int. Cl.
*G01R 31/3842* (2019.01)
*G01R 31/396* (2019.01)

(52) U.S. Cl.
CPC ....... *G01R 31/3842* (2019.01); *G01R 31/396* (2019.01)

(58) Field of Classification Search
CPC .............. G01R 31/3842; G01R 31/396; G01R 31/392; G01R 31/3646; G01R 31/367; G01R 31/382; Y02E 60/10
See application file for complete search history.

(56) References Cited

U.S. PATENT DOCUMENTS

| | | | | |
|---|---|---|---|---|
| 2005/0017686 | A1* | 1/2005 | Sakakibara | H01M 10/48 320/132 |
| 2007/0090844 | A1* | 4/2007 | Klang | H01M 10/48 324/426 |
| 2010/0039116 | A1* | 2/2010 | Tsenter | G01R 31/392 324/427 |
| 2015/0369871 | A1* | 12/2015 | Nishigaki | H01M 10/425 324/426 |
| 2020/0247268 | A1* | 8/2020 | Aoyama | G01R 31/392 |
| 2022/0111757 | A1* | 4/2022 | Nishioka | B60L 58/20 |

* cited by examiner

*Primary Examiner* — Akm Zakaria
(74) *Attorney, Agent, or Firm* — Slater Matsil, LLP

(57) ABSTRACT

In a battery diagnostic device and a method thereof, the battery diagnostic device can include a battery including at least one cell, a non-volatile memory, and a processor. The processor can store voltages of the at least one cell, which can be obtained at a plurality of time points, and pieces of information associated with times when the battery is driven, which can be obtained at the plurality of time points, obtain states of charge (SOCs) corresponding to the voltages of the at least one cell, identify an amount of discharge current of the at least one cell and a discharge rate of the at least one cell, based on obtaining the SOCs of the at least one cell, identify a state of the at least one cell, based on the amount of discharge current and the discharge rate, and store the state of the at least one cell.

20 Claims, 12 Drawing Sheets

| CELL NUMBER | FIRST DIAGNOSIS RESULT | SECOND DIAGNOSIS RESULT |
|---|---|---|
| 1 | X | X |
| 2 | X | O |
| 3 | O | X |
| ... | O | O |
| N | O | O |

201

| CELL NUMBER | ABNORMAL RISK |
|---|---|
| 1 | LOW |
| 2 | MIDDLE |
| 3 | MIDDLE |
| ... | HIGH |
| N | HIGH |

203

FIG.2

| | DIVISION | FIRST CASE | SECOND CASE | THIRD CASE | FOURTH CASE | FIFTH CASE | SIXTH CASE | SEVENTH CASE | EIGHTH CASE | NINTH CASE |
|---|---|---|---|---|---|---|---|---|---|---|
| FIRST CONDITION | IT IS POSSIBLE TO EXTRACT BMU DATA USING DIAGNOSER | O | O | O | O | O | O | O | O | X |
| SECOND CONDITION | CCS SUBSCRIBER | O | O | O | O | O | O | O | X | X |
| THIRD CONDITION | PAST DATA COLLECTION IS NORMAL AMONG CCS SUBSCRIBERS | O | O | O | O | O | O | X | X | X |
| FOURTH CONDITION | IT IS POSSIBLE TO IDENTIFY BSA UNIQUE NUMBER AFTER BATTERY IS REMOVED | O | O | O | O | O | X | X | X | X |
| FIFTH CONDITION | IT IS POSSIBLE TO COMMUNICATE WITH GDS AND CCS SERVER | O | O | O | O | X | X | X | X | X |
| SIXTH CONDITION | IT IS POSSIBLE TO USE CLOUD SERVER | O | O | O | X | X | X | X | X | X |
| SEVENTTH CONDITION | IT IS POSSIBLE TO USE APP | O | O | X | X | X | X | X | X | X |
| EIGHTH CONDITION | IT IS POSSIBLE TO USE WEB SERVER UI | O | X | X | X | X | X | X | X | X |
| SYSTEM COMBINATION | DATA PROVIDING ENTITY | B | B | B | B | B | B | B | B | B, D |
| | DATA CALCULATION ENTITY | C | C | C or D | C or D | D | D | D | D | B |
| | DATA DISPLAY ENTITY | D App, Web | D App | D | D | D | D | D | D | D |
| SYSTEM COMBINATION SUMMARY | FINAL COMBINATION 1 | B, C, D | B, C, D | B, C, D | B, C, D | B, D | B, D | B, D | B, D | B, D |
| | FINAL COMBINATION 2 | B, C, App | B, C, App | B, D | B, D | - | - | - | - | - |
| | FINAL COMBINATION 3 | B, C, Web | - | - | - | - | - | - | - | - |

B: BATTERY MANAGEMENT DEVICE D: BATTERY DIAGNOSTIC DEVICE C: SERVER
App: APPLICATION Web: WEB SERVER USER INTERFACE

FIG.8

BATTERY DIAGNOSTIC DEVICE AND METHOD THEREOF

CROSS-REFERENCE TO RELATED APPLICATIONS

This application claims the benefit of Korean Patent Application No. 10-2023-0156610, filed on Nov. 13, 2023, which application is hereby incorporated herein by reference.

TECHNICAL FIELD

The present disclosure relates to a battery diagnostic device and a method thereof.

BACKGROUND

With the development of technology for an eco-friendly vehicle, continuous research for a battery loaded into the eco-friendly vehicle has been in progress. For example, the eco-friendly vehicle may include a hybrid electric vehicle (HEV), an electric vehicle (EV), a plug-in hybrid electric vehicle (PHEV), and/or a fuel cell electric vehicle (FCEV).

There may be a need to diagnose cells included in the battery, after the battery included in the eco-friendly vehicle is separated. However, to diagnose the cells included in the battery, it may take about 8 hours for a capacity diagnosis and it may take about 24 hours for a safety diagnosis. Because it takes a long time for a battery diagnosis, there is a need for a method to shorten a time taken for the battery diagnosis.

SUMMARY

The present disclosure relates to a battery diagnostic device and a method thereof, and more particularly, relates to technologies of diagnosing whether a battery is abnormal.

Some embodiments of the present disclosure can solve the above-mentioned problems occurring in the prior art while advantages achieved by the prior art are maintained intact.

An embodiment of the present disclosure can provide a battery diagnostic device for identifying whether a battery removed from a vehicle is abnormal and a method thereof.

An embodiment of the present disclosure can provide a battery diagnostic device for identifying whether a battery is abnormal by using information at a past time point and information at a current time point and a method thereof.

An embodiment of the present disclosure can provide a battery diagnostic device for identifying whether a battery is abnormal in a relatively short time by identifying whether the battery is abnormal based on information at a past time point and information at a current time point.

Technical problems to be solved by some embodiments of the present disclosure are not necessarily limited to the aforementioned problems, and some embodiments can solve other technical problems not mentioned herein, which can be clearly understood from the following description by those skilled in the art to which the present disclosure pertains.

According to an embodiment of the present disclosure, a battery diagnostic device may include a battery including at least one cell, a non-volatile memory, and a processor. The processor may store voltages of the at least one cell, the voltages being obtained at a plurality of time points, and pieces of information associated with times when the battery is driven, the pieces of information being obtained at the plurality of time points, in the non-volatile memory, may obtain states of charge (SOCs) corresponding to the voltages of the at least one cell, based on converting the voltages of the at least one cell, the voltages obtained at the plurality of time points, may identify an amount of discharge current of the at least one cell and a discharge rate of the at least one cell, based on obtaining the SOCs of the at least one cell, may identify a state of the at least one cell, based on the amount of discharge current and the discharge rate, and may store the state of the at least one cell in the non-volatile memory.

In an embodiment, the processor may convert the voltages of the at least one cell based on an open circuit voltage (OCV) into the SOCs, based on a table stored in the non-volatile memory.

In an embodiment, the processor may identify a first SOC by a voltage of the at least one cell, the voltage being measured at a first time point, and a second SOC by a voltage of the at least one cell, the voltage being measured at a second time point subsequent to the first time point, may identify a first difference between the first time point and the second time point and a second difference between the first SOC and the second SOC, and may convert the first difference and the second difference in units of specified duration.

In an embodiment, the processor may identify the amount of discharge current of the at least one cell and the discharge rate of the at least one cell, based on the first difference converted in units of the specified duration and the second difference converted in units of the specified duration, and may identify the state of the at least one cell, based on the amount of discharge current and the discharge rate.

In an embodiment, the processor may obtain a first statistical value for the amount of discharge current of the at least one cell, may obtain a second statistical value for the discharge rate of the at least one cell, may obtain a specified range, based on the first statistical value and the second statistical value, and may identify the state of the at least one cell, based on the first statistical value, the second statistical value, and the specified range.

In an embodiment, the processor may identify that the state of the at least one cell is a normal state, based on that the first statistical value and the second statistical value are within the specified range, and may identify that the state of the at least one cell is an abnormal state, based on that at least one of the first statistical value or the second statistical value is out of the specified range.

In an embodiment, the processor may identify a risk of the at least one cell, based on that the state of the at least one cell is an abnormal state, may identify that the risk is a first level, based on that one of the first statistical value or the second statistical value is out of the specified range obtained by the first statistical value and the second statistical value, and may identify that the risk is a second level higher than the first level, based on that the first statistical value and the second statistical value are out of the specified range.

In an embodiment, the processor may identify a third time when the battery is ignition (Ig) on, may identify a fifth time point when a specified duration elapses from a fourth time point at which the battery is Ig off, and may identify a time when the battery is driven, based on the third time point and the fifth time point.

In an embodiment, the processor may display a screen indicating the state of the at least one cell on a display included in the battery diagnostic device or a portable device, or any combination thereof or may cause an external electronic device to display the state of the at least one cell, based on transmitting information indicating the state of the at least one cell to the external electronic device through a communication circuit.

In an embodiment, the processor may be included in at least one of a battery management unit (BMU), a battery management system (BMS), or a server, or any combination thereof.

According to an embodiment of the present disclosure, a battery diagnostic method may include storing, by a processor, voltages of at least one cell, the voltages being obtained at a plurality of time points, and pieces of information associated with times when a battery is driven, the pieces of information being obtained at the plurality of time points, in a non-volatile memory, obtaining, by the processor, states of charge (SOCs) corresponding to the voltages of the at least one cell, based on converting the voltages of the at least one cell, the voltage being obtained at the plurality of time points, identifying, by the processor, an amount of discharge current of the at least one cell and a discharge rate of the at least one cell, based on obtaining the SOCs of the at least one cell, identifying a state of the at least one cell, based on the amount of discharge current and the discharge rate, and storing the state of the at least one cell in the non-volatile memory.

The battery diagnostic method according to an embodiment may further include converting the voltages of the at least one cell based on an open circuit voltage (OCV) into the SOCs, based on a table stored in the non-volatile memory.

The battery diagnostic method according to an embodiment may further include identifying a first SOC by a voltage of the at least one cell, the voltage being measured at a first time point, and a second SOC by a voltage of the at least one cell, the voltage being measured at a second time point subsequent to the first time point, identifying a first difference between the first time point and the second time point and a second difference between the first SOC and the second SOC, and converting the first difference and the second difference in units of specified duration.

The battery diagnostic method according to an embodiment may further include identifying the amount of discharge current of the at least one cell and the discharge rate of the at least one cell, based on the first difference converted in units of the specified duration and the second difference converted in units of the specified duration, and identifying the state of the at least one cell, based on the amount of discharge current and the discharge rate.

The battery diagnostic method according to an embodiment may further include obtaining a first statistical value for the amount of discharge current of the at least one cell, obtaining a second statistical value for the discharge rate of the at least one cell, obtaining a specified range, based on the first statistical value and the second statistical value, and identifying the state of the at least one cell, based on the first statistical value, the second statistical value, and the specified range.

The battery diagnostic method according to an embodiment may further include identifying that the state of the at least one cell is a normal state, based on that the first statistical value and the second statistical value are within the specified range, and identifying that the state of the at least one cell is an abnormal state, based on that at least one of the first statistical value or the second statistical value is out of the specified range.

The battery diagnostic method according to an embodiment may further include identifying a risk of the at least one cell, based on that the state of the at least one cell is an abnormal state, identifying that the risk is a first level, based on that one of the first statistical value or the second statistical value is out of the specified range obtained by the first statistical value and the second statistical value, and identifying that the risk is a second level higher than the first level, based on that the first statistical value and the second statistical value are out of the specified range.

The battery diagnostic method according to an embodiment may further include identifying a third time when the battery is ignition (Ig) on, identifying a fifth time point when a specified duration elapses from a fourth time point at a fourth time point when the battery is Ig off, and identifying a time when the battery is driven, based on the third time point and the fifth time point.

The battery diagnostic method according to an embodiment may further include displaying a screen indicating the state of the at least one cell on a display included in at least one of a battery diagnostic device or a portable device, or any combination thereof or causing an external electronic device to display the state of the at least one cell, based on transmitting information indicating the state of the at least one cell to the external electronic device through a communication circuit.

In an embodiment, the processor may be included in at least one of a battery management unit (BMU), a battery management system (BMS), or a server, or any combination thereof.

BRIEF DESCRIPTION OF THE DRAWINGS

The above and other features and advantages of the present disclosure can be more apparent from the following detailed description taken in conjunction with the accompanying drawings, in which:

FIG. 2 illustrates an example associated with the result of diagnosing at least one cell included in a battery, in an embodiment of the present disclosure;

FIG. 8 illustrates an example of a battery diagnostic system in which various pieces of hardware or software are used according to conditions, in an embodiment of the present disclosure.

DETAILED DESCRIPTION OF ILLUSTRATIVE EMBODIMENTS

Figure 1:
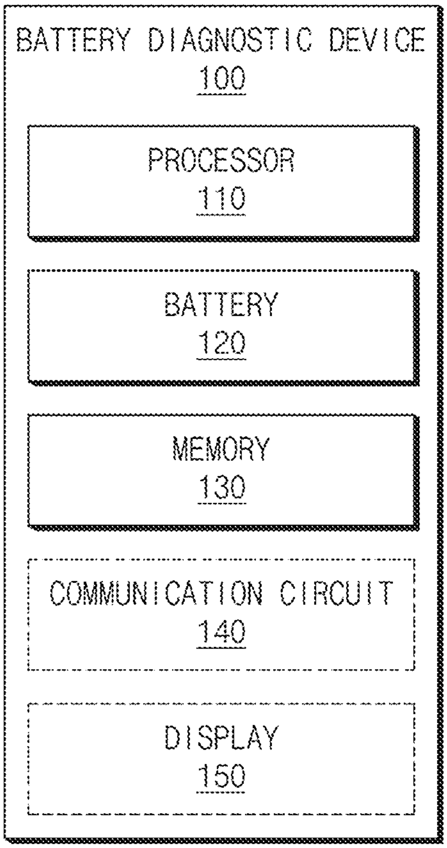
FIG. 1 illustrates an example of a block diagram associated with a battery diagnostic device according to an embodiment of the present disclosure.

Hereinafter, some example embodiments of the present disclosure can be described in detail with reference to the drawings. In adding the reference numerals to the components of each drawing, it can be noted that the identical component is designated by the identical numerals even when they are displayed on other drawings. In addition, a detailed description of well-known features or functions can be omitted to not unnecessarily obscure the gist of the present disclosure.

In describing components of example embodiments of the present disclosure, the terms "first", "second", "A", "B", "(a)", "(b)", and the like, may be used herein. Such terms can be used merely to distinguish one component from another component, but do not necessarily limit the corresponding components irrespective of the order or priority of the corresponding components. Furthermore, unless otherwise defined, all terms including technical and scientific terms used herein have the same meaning as being generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, example embodiments of the present disclosure can be described in detail with reference to FIGS. 1 to 9.

FIG. 1 illustrates an example of a block diagram associated with a battery diagnostic device according to an embodiment of the present disclosure.

Referring to FIG. 1, a battery diagnostic device 100 according to an embodiment of the present disclosure may be implemented inside or outside a vehicle, and some of components included in the battery diagnostic device 100 may be implemented inside or outside the vehicle. In this example, the battery diagnostic device 100 may be integrally configured with control units in the vehicle or may be implemented as a separate device to be connected with the control units of the vehicle by a separate connection method. For example, the battery diagnostic device 100 may further include components which are not shown in FIG. 1.

The battery diagnostic device 100 according to an embodiment may include a processor 110, a battery 120, and a memory 130, any combination of or all of which may be in plural or may include plural components thereof. For example, the battery diagnostic device 100 may further include at least one of a communication circuit 140 or a display 150, or any combination thereof. The processor 110, the battery 120, the memory 130, the communication circuit 140, and the display 150 may be electronically or operably coupled with each other by an electronic component including a communication bus.

Hereinafter, that pieces of hardware are operably coupled with each other may include that a direct connection or an indirect connection between the pieces of hardware is established in a wired or wireless manner, such that second hardware is controlled by first hardware among the pieces of hardware.

The different blocks are illustrated, but an embodiment is not limited thereto. Some of the pieces of hardware of FIG. 1 may be included in a single integrated circuit including a system on a chip (SoC). Types of the pieces of hardware included in the battery diagnostic device 100 and/or the number of the pieces of hardware are/is not limited to those shown in FIG. 1. For example, the battery diagnostic device 100 may include only some of the pieces of hardware shown in FIG. 1.

The battery diagnostic device 100 according to an embodiment may include hardware for processing data, based on one or more instructions. For example, the hardware for processing the data may include the processor 110. For example, the hardware for processing the data may include an arithmetic and logic unit (ALU), a floating point unit (FPU), a field programmable gate array (FPGA), a central processing unit (CPU), and/or an application processor (AP). The processor 110 may have a structure of a single-core processor or may have a structure of a multi-core processor including a dual core, a quad core, a hexa core, or an octa core.

In FIG. 1, the processor 110 is illustrated as a block included in the battery diagnostic device 100, but an embodiment is not limited thereto. For example, the processor 110 may be included in a battery management device and/or may be included in an external electronic device including a server. For example, the battery management device may include at least one of a battery management unit (BMU) or a battery management system (BMS), or any combination thereof.

The battery 120 included in the battery diagnostic device 100 according to an embodiment may include at least one cell. For example, the battery diagnostic device 100 may diagnose a state of the at least one cell included in the battery 120.

The memory 130 included in the battery diagnostic device 100 according to an embodiment may include a hardware component for storing data and/or an instruction input and/or output from the processor 110 of the battery diagnostic device 100.

For example, the memory 130 (storage medium) may include a volatile memory including a random-access memory (RAM) and/or a non-volatile memory including a read-only memory (ROM) and/or remote database and/or a blockchain database.

For example, the volatile memory may include at least one of a dynamic RAM (DRAM), a static RAM (SRAM), a cache RAM, or a pseudo SRAM (PSRAM), or any combination thereof.

For example, the non-volatile memory may include at least one of a programmable ROM (PROM), an erasable PROM (EPROM), an electrically erasable PROM (EEPROM), a flash memory, a hard disk, a compact disc, a solid state drive (SSD), or an embedded multi-media card (eMMC), or any combination thereof.

The communication circuit 140 included in the battery diagnostic device 100 according to an embodiment may include a hardware component for supporting transmission and/or reception of a signal between the battery diagnostic device 100 and the external electronic device. For example, the communication circuit 140 may include at least one of a modem, an antenna, or an optic/electronic (O/E) converter, or any combination thereof.

For example, the communication circuit 140 may support transmission and/or reception of a signal based on various types of protocols including at least one of an Ethernet, a local area network (LAN), a wide area network (WAN), wireless-fidelity (Wi-Fi), Bluetooth, Bluetooth low energy (BLE), ZigBee, long term evolution (LTE), 5th generation new radio (5G NR), a controller area network (CAN), or a local interconnect network (LIN), or any combination thereof. However, an embodiment of the present disclosure is not limited to those described above.

The display 150 of the battery diagnostic device 100 according to an embodiment may provide a user with visualized information. For example, the display 150 may be controlled by at least one of the processor 110 or a graphic processing unit (GPU) (not shown), or any combination thereof to provide the user with visualized information.

For example, the display 150 may include at least one of a flat panel display (FPD), an electronic paper, or a flexible display, or any combination thereof. For example, the FPD may include at least one of a liquid crystal display (LCD), a plasma display panel (PDP), a digital mirror device (DMD), at least one light emitting diode (LED), or a micro-LED, or any combination thereof. The LED may include an organic LED (OLED). However, an embodiment of the present disclosure is not limited to those described above.

In an embodiment, the processor 110 may obtain voltages of the at least one cell at a plurality of time points. The processor 110 may obtain pieces of information associated with times in which the battery 120 is driven at the plurality of time points. The processor 110 may store the voltages of the at least one cell, which are obtained at the plurality of time points, and the pieces of information associated with the times when the battery 120 is driven, which are obtained at the plurality of time points, in the non-volatile memory.

In an embodiment, the processor 110 may convert the voltages of the at least one cell, which are obtained at the plurality of time points. For example, the processor 110 may obtain state of charges (SOCs) of the at least one cell, which correspond to the voltages of the at least one cell, based on converting the voltages of the at least one cell, which are obtained at the plurality of time points.

For example, the processor 110 may convert the voltages of the at least one cell based on an open circuit voltage (OCV) into the SOCs, based on a table stored in the non-volatile memory. For example, the table stored in the non-volatile memory may include each of SOCs respectively corresponding to OCVs. The processor 110 may identify an OCV corresponding to the voltage of the at least one cell from the table stored in the non-volatile memory and may identify an SOC matched with the OCV corresponding to the voltage of the at least one cell. The processor 110 may convert the voltage of the at least one cell from the OCV to the SOC, based on identifying the SOC matched with the OCV corresponding to the voltage of the at least one cell.

In an embodiment, the processor 110 may identify a first SOC by a first voltage of the at least one cell, which is measured at a first time point. The processor 110 may identify a second SOC by a second voltage of the at least one cell, which is measured at a second time point subsequent to the first time point.

The processor 110 may identify a first difference between the first time point and the second time point. The processor 110 may identify a second difference between the first SOC and the second SOC. The processor 110 may convert the first difference and the second difference in units of specified duration, based on identifying the first difference and the second difference. For example, the specified duration may include a minute, an hour, a day, a week, and/or a month. However, the present disclosure is not limited to those described above.

In an embodiment, the processor 110 may identify a third time point at which the battery 120 is ignition (Ig) on. The processor 110 may identify a fourth time point at which the battery 120 is Ig off. The processor 110 may identify a fifth time point when a specified duration elapses from the fourth time point at which the battery 120 is Ig off. The processor 110 may identify a time when the battery 120 is driven, based on the third time point and the fifth time point.

In an embodiment, the processor 110 may identify an amount of discharge current of the at least one cell, based on obtaining the SOCs of the at least one cell. The processor 110 may identify a discharge rate of the at least one cell, based on obtaining the SOCs of the at least one cell.

For example, the processor 110 may identify an amount of discharge current of the at least one cell, based on the first difference converted in units of the specified duration and the second difference converted in units of the specified duration. For example, the processor 110 may identify a discharge rate of the at least one cell, based on the first difference converted in units of the specified duration and the second difference converted in units of the specified duration.

In an embodiment, the processor 110 may identify a state of the at least one cell, based on the amount of discharge current of the at least one cell. The processor 110 may identify a state of the at least one cell, based on the discharge rate of the at least one cell. The processor 110 may identify a state of the at least one cell, based on the amount of discharge current of the at least one cell and the discharge rate of the at least one cell. For example, the state of the at least one cell may include a normal state and an abnormal state different from the normal state.

In an embodiment, the processor 110 may store the state of the at least one cell in the non-volatile memory. In an embodiment, the processor 110 may represent the state of the at least one cell on the display 150 or may transmit information for representing the state of the at least one cell to the external electronic device through the communication circuit 140.

In an embodiment, the processor 110 may obtain a first statistical value for the amount of discharge current of the at least one cell. Hereinafter, the statistical value may include a statistic. For example, the statistic may include at least one of a population statistic, a sample statistic, a test statistic, or an estimated statistic, or any combination thereof. For example, the statistic may include at least one of a population mean, a population variance, a population proportion, a sample mean, a sample variance, a sample proportion, or a sample moment, or any combination thereof. For example, the statistic may include a scatter plot. For example, the scatter plot may include at least one of a range, an interquartile range, a variance, a standard deviation, an absolute deviation, or a coefficient of variation, or any combination thereof. However, the present disclosure is not limited to those described above.

In an embodiment, the processor 110 may obtain a second statistical value for the discharge rate of the at least one cell. The processor 110 may obtain a specified range, based on the first statistical value for the amount of discharge current of the at least one cell and the second statistical value for the discharge rate of the at least one cell. For example, the specified range may include 3-sigma. However, the present disclosure is not limited to that described above.

In an embodiment, the processor 110 may identify a state of the at least one cell, based on the first statistical value for the amount of discharge current of the at least one cell, the second statistical value for the discharge rate of the at least one cell, and the specified range.

In an embodiment, the processor 110 may identify that the state of the at least one cell is the normal state, based on that the first statistical value and the second statistical value are within the specified range. In an embodiment, the processor 110 may identify that the state of the at least one cell is the abnormal state, based on that at least one of the first statistical value or the second statistical value is out of the specified range.

In an embodiment, the processor 110 may identify a risk of the at least one cell, based on that the state of the at least one cell is the abnormal state. For example, the processor 110 may identify that the risk of the at least one cell is level 0, based on that the state of the at least one cell is the normal state. For example, level 0 may include that the risk is "low".

In an embodiment, the processor 110 may identify that at least one of the first statistical value or the second statistical value is out of the specified range obtained by the first statistical value and the second statistical value. For example, the processor 110 may identify that one of the first statistical value or the second statistical value is out of the specified range obtained by the first statistical value and the second statistical value. In an embodiment, the processor 110 may identify that the risk of the at least one cell is a first level, based on that one of the first statistical value or the second statistical value is out of the specified range.

In an embodiment, the processor 110 may identify that the first statistical value and the second statistical value are out of the specified range. In an embodiment, the processor 110 may identify that the risk of the at least one cell is a second level higher than the first level, based on that the first statistical value and the second statistical value are out of the specified range.

In an embodiment, the processor 110 may display a screen indicating the state of the at least one cell, on a display included in at least one of the battery diagnostic device 100 or the battery management device, or any combination thereof. For example, the battery management device may be referred to as a portable device. For example, the portable device may include at least one of a mobile phone, a laptop, or a wearable device, or any combination thereof.

In an embodiment, the processor 110 may transmit data indicating the state of the at least one cell to a second external electronic device including the portable device through a first external electronic device including a server. For example, the processor 110 may transmit the data indicating the state of the at least one cell to the second external electronic device through the first external electronic device by using the communication circuit 140.

In an embodiment, the processor 110 may display a screen indicating the state of the at least one cell, on a display included in at least one of the battery diagnostic device 100 or the portable device, or any combination thereof. The processor 110 may cause the external electronic device to display the state of the at least one cell, based on transmitting information indicating the state of the at least one cell to the external electronic device through the communication circuit 140.

As described above, the battery diagnostic device 100 according to an embodiment may identify whether the at least one cell included in the battery 120 is abnormal based on information at a past time point and information at a current time point, thus identifying whether the battery 120 is abnormal in a relatively short time.

FIG. 2 illustrates an example associated with the result of diagnosing at least one cell included in a battery, in an embodiment of the present disclosure.

Referring to FIG. 2, a processor (e.g., a processor 110 of FIG. 1) of a battery diagnostic device (e.g., a battery diagnostic device 100 of FIG. 1) according to an embodiment may diagnose at least one cell included in a battery (e.g., a battery 120 of FIG. 1).

Referring to a first example 201 of FIG. 2, the processor of the battery diagnostic device according to an embodiment may diagnose an amount of discharge current and/or a discharge time of the at least one cell included in the battery.

For example, the processor may obtain a first diagnosis result, based on diagnosing the amount of discharge current of the at least one cell. For example, the processor may obtain a second diagnosis result, based on diagnosing the discharge time of the at least one cell.

For example, the processor may obtain first information before the battery is removed or before the battery is separated from the vehicle. The processor may obtain second information at a current time point after the battery is separated from the vehicle. For example, the first information and/or the second information may include voltage information of the at least one cell and/or time information associated with a time when the voltage information of the at least one cell is measured.

In an embodiment, the processor may obtain the first diagnosis result and/or the second diagnosis result, based on the first information and/or the second information. For example, the processor may obtain the first diagnosis result associated with the amount of discharge current of the at least one cell, based on the first information and/or the second information.

For example, the processor may obtain the first diagnosis result, based on whether a scatter plot for the amount of discharge current of the at least one cell is greater than a specified range (e.g., 3-sigma). The processor may identify that the state of the at least one cell is an abnormal state, based on that the scatter plot for the amount of discharge current of the at least one cell is greater than the specified range. The processor may identify that the state of the at least one cell is a normal state, based on that the scatter plot for the amount of discharge current of the at least one cell is less than or equal to the specified range.

For example, the processor may obtain a scatter plot for a discharge rate of the at least one cell. For example, the processor may obtain the second diagnosis result, based on whether the scatter plot for the discharge rate of the at least one cell is greater than the specified range (e.g., 3-sigma). For example, the processor may identify that the state of the at least one cell is the abnormal state, based on that the scatter plot for the discharge rate of the at least one cell is greater than the specified range. For example, the processor may identify that the state of the at least one cell is the normal state, based on that the scatter plot for the discharge rate of the at least one cell is less than or equal to the specified range. The first example 201 of FIG. 2 illustrates an example in which the normal state is represented as "X" and the abnormal state is represented as "O".

Referring to a second example 203 of FIG. 2, the processor of the battery diagnostic device according to an embodiment may identify an abnormal risk of the at least one cell, based on the first diagnosis result and the second diagnosis result.

For example, the processor may identify the abnormal risk of the at least one cell, based on a combination of the first diagnosis result and the second diagnosis result. For example, the processor may identify that the abnormal risk of the at least one cell is "low", based on that the first diagnosis result and the second diagnosis result are the normal state. For example, the processor may identify that the abnormal risk of the at least one cell is "middle", based on that one of the first diagnosis result or the second diagnosis result is the abnormal state and the other is the normal state. For example, the processor may identify that the abnormal risk of the at least one cell is "high", based on that the first diagnosis result and the second diagnosis result are the abnormal state.

For example, the processor may identify the abnormal risk of the at least one cell, based on at least one cell's number, the first diagnosis result, and the second diagnosis result. For example, the processor may store a table, such as the second example 203, including the at least one cell's number and the abnormal risk of the at least one cell in a memory (e.g., a first memory 130 of FIG. 1).

In an embodiment, the processor may represent the at least one cell's number and the abnormal risk of the at least one cell on a display (e.g., a display 150 of FIG. 1).

Figure 3:
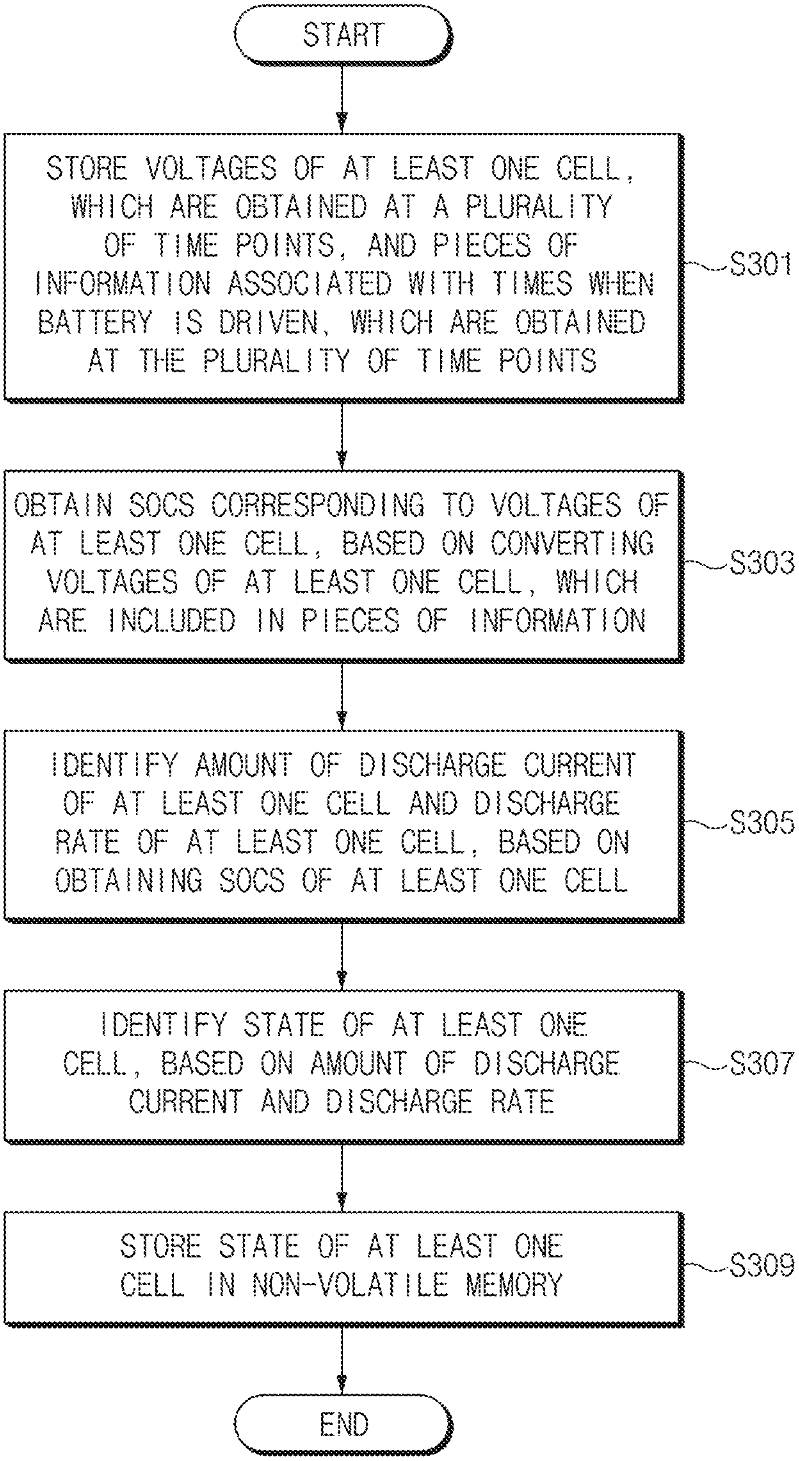
FIG. 3 illustrates an example of a flowchart associated with a battery diagnostic method according to an embodiment of the present disclosure.

FIG. 3 illustrates an example of a flowchart associated with a battery diagnostic method according to an embodiment of the present disclosure.

At least one of the operations of FIG. 3 may be performed by the battery diagnostic device 100 of FIG. 1. The respective operations of FIG. 3 may be sequentially performed, but are not necessarily sequentially performed. For example, an order of the respective operations may be changed, and at least two operations may be performed in parallel.

Referring to FIG. 3, in operation S301, the battery diagnostic method according to an embodiment may include storing voltages of at least one cell, which are obtained at a plurality of time points, and pieces of information associated with times when a battery is driven, which are obtained at the plurality of time points.

In operation S303, the battery diagnostic method according to an embodiment may include obtaining SOCs corresponding to the voltages of the at least one cell, based on converting the voltages of the at least one cell, which are included in the pieces of information.

The battery diagnostic method according to an embodiment may include converting the voltages of the at least one cell based on an OCV into the SOCs, based on a table stored in a non-volatile memory.

The battery diagnostic method according to an embodiment may include identifying a first SOC by a voltage of the at least one cell, which is measured at a first time point, and a second SOC by a voltage of the at least one cell, which is measured at a second time point subsequent to the first time point. The battery diagnostic method may include identifying a first difference between the first time point and the second time point and a second difference between the first SOC and the second SOC. The battery diagnostic method may include converting the first difference and the second difference in units of specified duration.

The battery diagnostic method according to an embodiment may include identifying a third time point when the battery is Ig on. The battery diagnostic method may include identifying a fourth time point when the battery is Ig off. The battery diagnostic method may include identifying a fifth time point when a specified duration elapses from the fourth time point when the battery is Ig off. The battery diagnostic method may include identifying a time when the battery is driven, based on the third time point and the fifth time point.

In operation S305, the battery diagnostic method according to an embodiment may include identifying an amount of discharge current of the at least one cell and a discharge rate of the at least one cell, based on obtaining the SOCs of the at least one cell.

The battery diagnostic method according to an embodiment may include identifying the amount of discharge current of the at least one cell, based on the first difference converted in units of the specified duration and the second difference converted in units of the specified duration. The battery diagnostic method may include identifying the discharge rate of the at least one cell, based on the first difference converted in units of the specified duration and the second difference converted in units of the specified duration. The battery diagnostic method may include identifying the amount of discharge current of the at least one cell and/or the discharge rate of the at least one cell, based on the first difference converted in units of the specified duration and the second difference converted in units of the specified duration.

In operation S307, the battery diagnostic method according to an embodiment may include identifying a state of the at least one cell, based on the amount of discharge current and the discharge rate.

The battery diagnostic method according to an embodiment may include obtaining a first statistical value for the amount of discharge current of the at least one cell. The battery diagnostic method may include obtaining a second statistical value for the discharge rate of the at least one cell. The battery diagnostic method may include obtaining a specified range, based on the first statistical value and the second statistical value. The battery diagnostic method may include identifying the state of the at least one cell, based on the first statistical value, the second statistical value, and/or the specified range.

The battery diagnostic method according to an embodiment may include identifying whether the first statistical value and the second statistical value are within the specified range. The battery diagnostic method may include identifying that the state of the at least one cell is a normal state, based on that the first statistical value and the second statistical value are within the specified range. The battery diagnostic method may include identifying that the state of the at least one cell is an abnormal state, based on that at least one of the first statistical value or the second statistical value is out of the specified range.

The battery diagnostic method according to an embodiment may include identifying a risk of the at least one cell, based on that the state of the at least one cell is the abnormal state.

For example, the battery diagnostic method may include identifying that the risk of the at least one cell is a first level, based on one of the first statistical value or the second statistical value is out of the specified range obtained by the first statistical value and the second statistical value.

For example, the battery diagnostic method may include identifying that the risk is a second level higher than the first level, based on that the first statistical value and the second statistical value are out of the specified range.

In operation S309, the battery diagnostic method according to an embodiment may include storing the state of the at least one cell in a non-volatile memory.

The battery diagnostic method according to an embodiment may include displaying a screen representing the state of the at least one cell, on a display included in at least one of a battery diagnostic device or a battery management device, or any combination thereof.

As described above, the battery diagnostic method according to an embodiment may be to identify whether the at least one cell included in the battery is abnormal, by using the pieces of information corresponding to the plurality of time points. The battery diagnostic method may be to identify whether the at least one cell included in the battery is abnormal, based on information corresponding to a past time point and information corresponding to a current time point, thus diagnosing the battery at a relatively short time.

Figure 4:
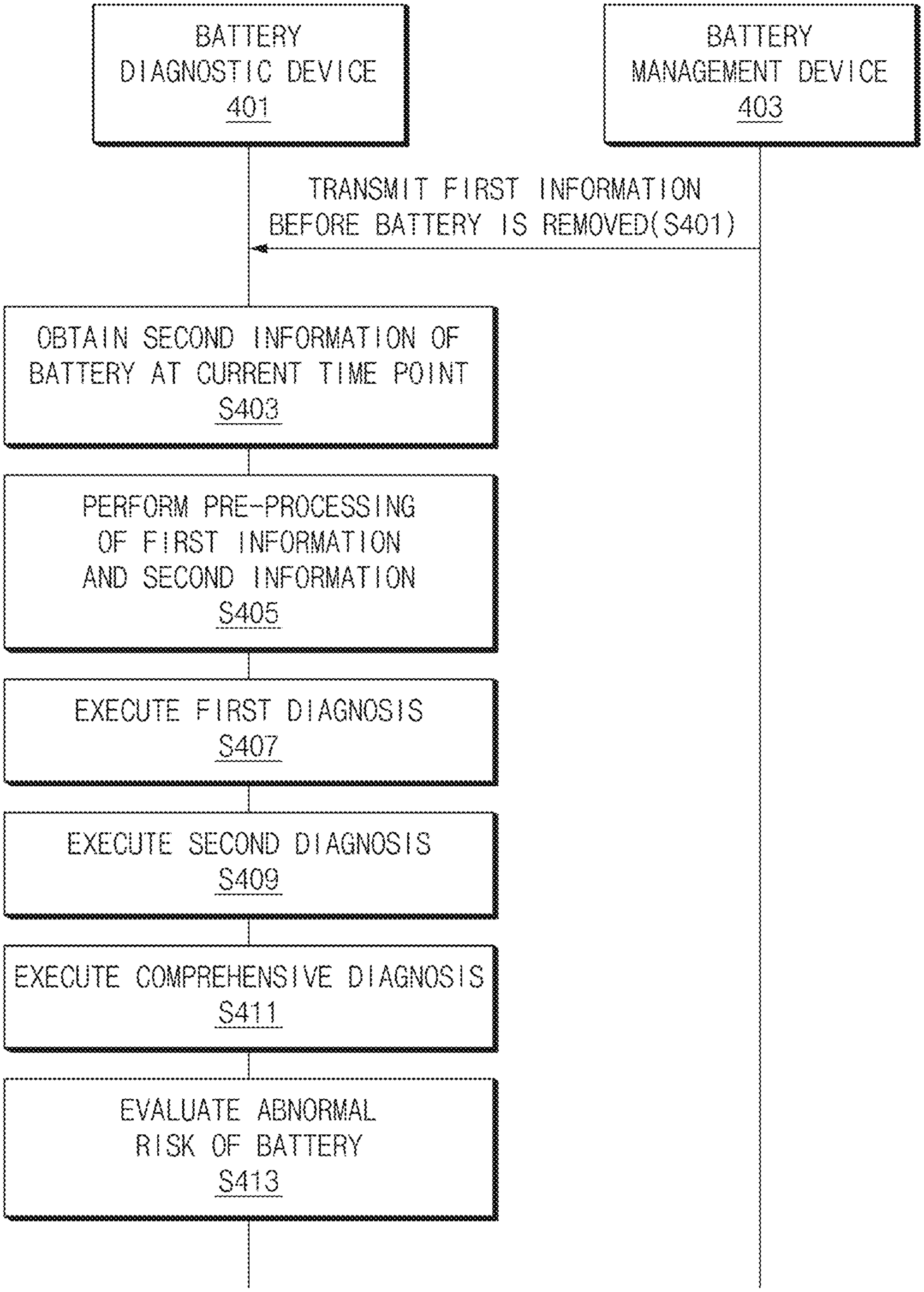
FIG. 4 illustrates an example associated with a signal sequence diagram associated with a battery diagnostic system, in an embodiment of the present disclosure.

FIG. 4 illustrates an example associated with a signal sequence diagram associated with a battery diagnostic system, in an embodiment of the present disclosure.

The respective operations of FIG. 4 may be sequentially performed, but are not necessarily sequentially performed. For example, an order of the respective operations may be changed, and at least two operations may be performed in parallel.

Referring to FIG. 4, in operation S401, a battery management device 403 may transmit first information before a battery is removed to a battery diagnostic device 401. For example, the first information before the battery is removed may include information before the battery is separated from a vehicle. For example, the first information may include voltage information associated with a voltage of at least one cell included in the battery and/or time information associated with a time when the voltage information is measured. For example, the first information may include voltage information obtained at a past time point and time information obtained at the past time point.

In operation S403, in an embodiment, the battery diagnostic device 401 may obtain second information of the battery at a current time point. For example, the second information may include voltage information of the at least one cell at the current time point and/or time information at the current time point.

In operation S405, in an embodiment, the battery diagnostic device 401 may perform pre-processing of the first information and the second information. For example, the pre-processing may include converting voltage information into an SOC. For example, the pre-processing may include obtaining a difference between a time point when the first information is obtained and a time point when the second information is obtained.

In operation S407, in an embodiment, the battery diagnostic device 401 may execute a first diagnosis.

For example, the first diagnosis may include a diagnosis of an amount of discharge current of the at least one cell. For example, the first diagnosis may include identifying whether a statistical value for the amount of discharge current of the at least one cell is out of a specified range, based on obtaining the statistical value. For example, the statistical value may be associated with the statistic described with reference to FIG. 1.

In operation S409, in an embodiment, the battery diagnostic device 401 may execute a second diagnosis.

For example, the second diagnosis may include a diagnosis of a discharge rate of the at least one cell. For example, the second diagnosis may include identifying whether a statistical value for the discharge rate of the at least one cell is out of the specified range, based on obtaining the statistical value. For example, the statistical value may be associated with the statistic described with reference to FIG. 1.

In operation S411, in an embodiment, the battery diagnostic device 401 may execute a comprehensive diagnosis.

For example, the comprehensive diagnosis may include identifying a state of the at least one cell, based on results of the first diagnosis and the second diagnosis.

In operation S413, in an embodiment, the battery diagnostic device 401 may evaluate an abnormal risk of the battery. For example, evaluating the abnormal risk of the battery may include identifying a risk of the at least one cell included in the battery.

For example, the battery diagnostic device 401 may identify an abnormal risk of the battery and/or an abnormal risk of the at least one cell, based on a first result of the first diagnosis and a second result of the second diagnosis.

For example, the battery diagnostic device 401 may evaluate that the abnormal risk of the battery and/or the abnormal risk of the at least one cell are/is “low”, based on that the first result and the second result are a normal state.

For example, the battery diagnostic device 401 may evaluate that the abnormal risk of the battery and/or the abnormal risk of the at least one cell are/is “middle”, based on that one of the first result or the second result is an abnormal state.

For example, the battery diagnostic device 401 may evaluate that the abnormal risk of the battery and/or the abnormal risk of the at least one cell are/is “high”, based on that the first result and the second result are the abnormal state.

Figure 5:
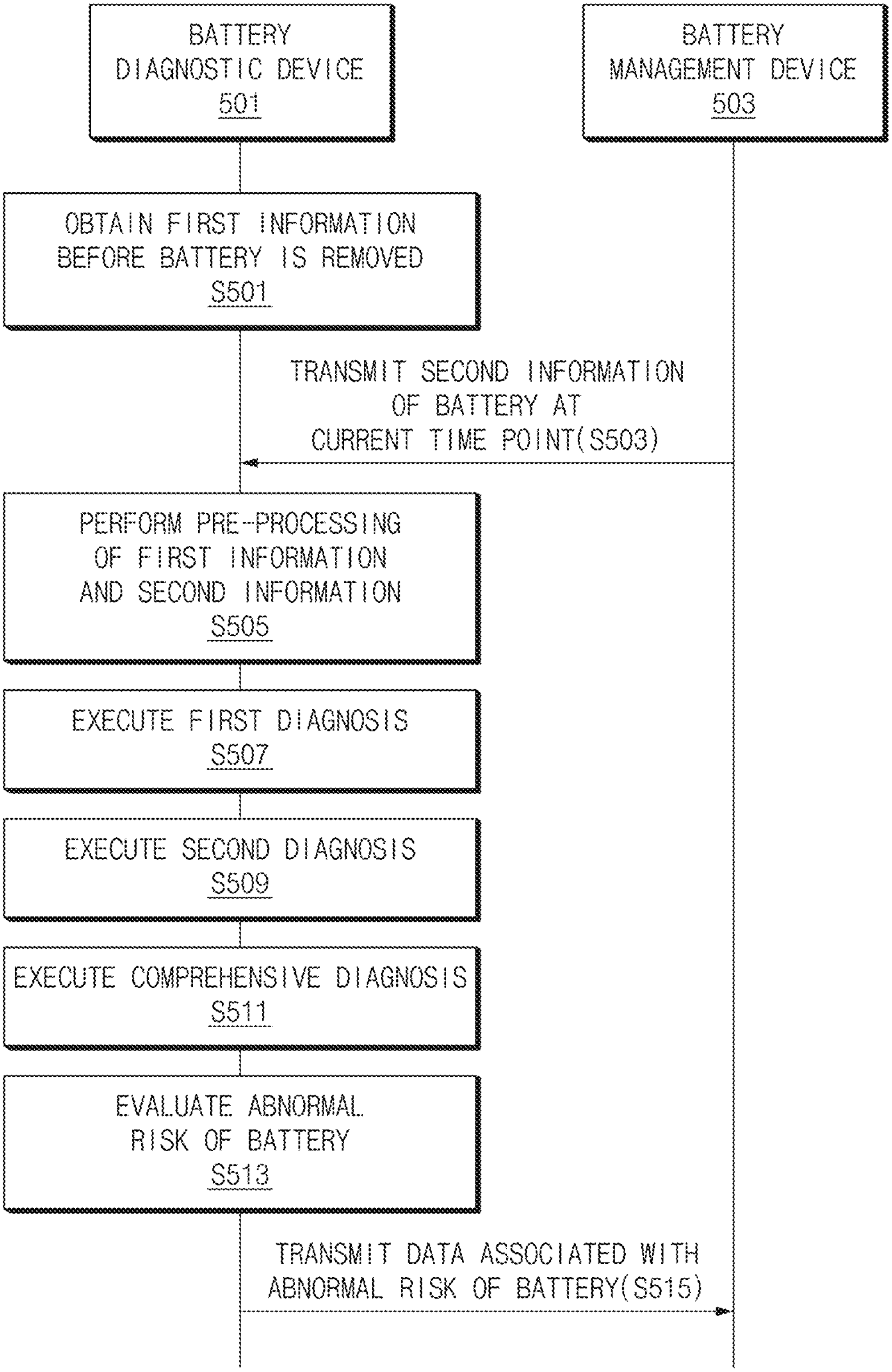
FIG. 5 illustrates an example of a signal sequence diagram associated with a battery diagnostic system, in an embodiment of the present disclosure.

FIG. 5 illustrates an example of a signal sequence diagram associated with a battery diagnostic system, in an embodiment of the present disclosure.

The respective operations of FIG. 5 may be sequentially performed, but are not necessarily sequentially performed. For example, an order of the respective operations may be changed, and at least two operations may be performed in parallel.

In operation S501, in an embodiment, a battery management device 501 may obtain first information before a battery is removed. For example, the first information before the battery is removed may include a voltage of the at least one cell and/or a voltage of the battery, immediately after the battery is Ig on and after a specified duration elapses from a time point when the battery is Ig off. For example, the first information before the battery is removed may include time information associated with a time point when a voltage of the at least one cell and/or a voltage of the battery is measured.

In operation S503, in an embodiment, the battery diagnostic device 503 may transmit second information of the battery at the current time point. For example, the second information may include a voltage of the at least one cell and/or a voltage of the battery, which are/is measured at the current time point. For example, the second information may include time information associated with a voltage of the at least one cell and/or a voltage of the battery are/is measured.

In operation S505, in an embodiment, the battery management device 501 may perform pre-processing of the first information and the second information. For example, the battery management device 501 may convert a voltage of the at least one cell, which is included in the first information and the second information, into an SOC. For example, the battery management device 501 may convert the voltage of the at least one cell based on an OCV into the SOC, based on a table stored in a non-volatile memory.

For example, the battery management device 501 may identify a difference between a first time point when a voltage of the at least one cell before the battery is removed is measured and a second time point when a voltage of the at least one cell is currently measured. For example, the battery management device 501 may convert the difference between the first time point and the second time point in units of specified duration.

In operation S507, in an embodiment, the battery management device 501 may execute a first diagnosis.

For example, the first diagnosis may include a diagnosis of an amount of discharge current of the at least one cell. For example, the first diagnosis may include identifying whether a statistical value for the amount of discharge current of the at least one cell is out of a specified range, based on obtaining the statistical value.

In operation S509, in an embodiment, the battery management device 501 may execute a second diagnosis.

For example, the second diagnosis may include a diagnosis of a discharge rate of the at least one cell. For example, the second diagnosis may include identifying whether a statistical value for the discharge rate of the at least one cell is out of the specified range, based on obtaining the statistical value.

In operation S511, in an embodiment, the battery management device 501 may execute a comprehensive diagnosis.

For example, the comprehensive diagnosis may include identifying a state of the at least one cell, based on results of the first diagnosis and the second diagnosis.

In operation S513, in an embodiment, the battery management device 501 may evaluate an abnormal risk of the battery.

For example, the battery management device 501 may identify an abnormal risk of the battery and/or an abnormal risk of the at least one cell, based on a first result of the first diagnosis and a second result of the second diagnosis.

For example, the battery management device 501 may evaluate that the abnormal risk of the battery and/or the abnormal risk of the at least one cell are/is "low", based on that the first result and the second result are a normal state.

For example, the battery management device 501 may evaluate that the abnormal risk of the battery and/or the abnormal risk of the at least one cell are/is "middle", based on that one of the first result or the second result is an abnormal state.

For example, the battery management device 501 may evaluate that the abnormal risk of the battery and/or the abnormal risk of the at least one cell are/is "high", based on that the first result and the second result are the abnormal state.

In operation S515, in an embodiment, the battery management device 501 may transmit data associated with the abnormal risk of the battery to the battery diagnostic device 503.

In an embodiment, the battery diagnostic device 503 may display a screen representing the abnormal risk of the battery, on a display, based on the data transmitted from a sever.

Figure 6:
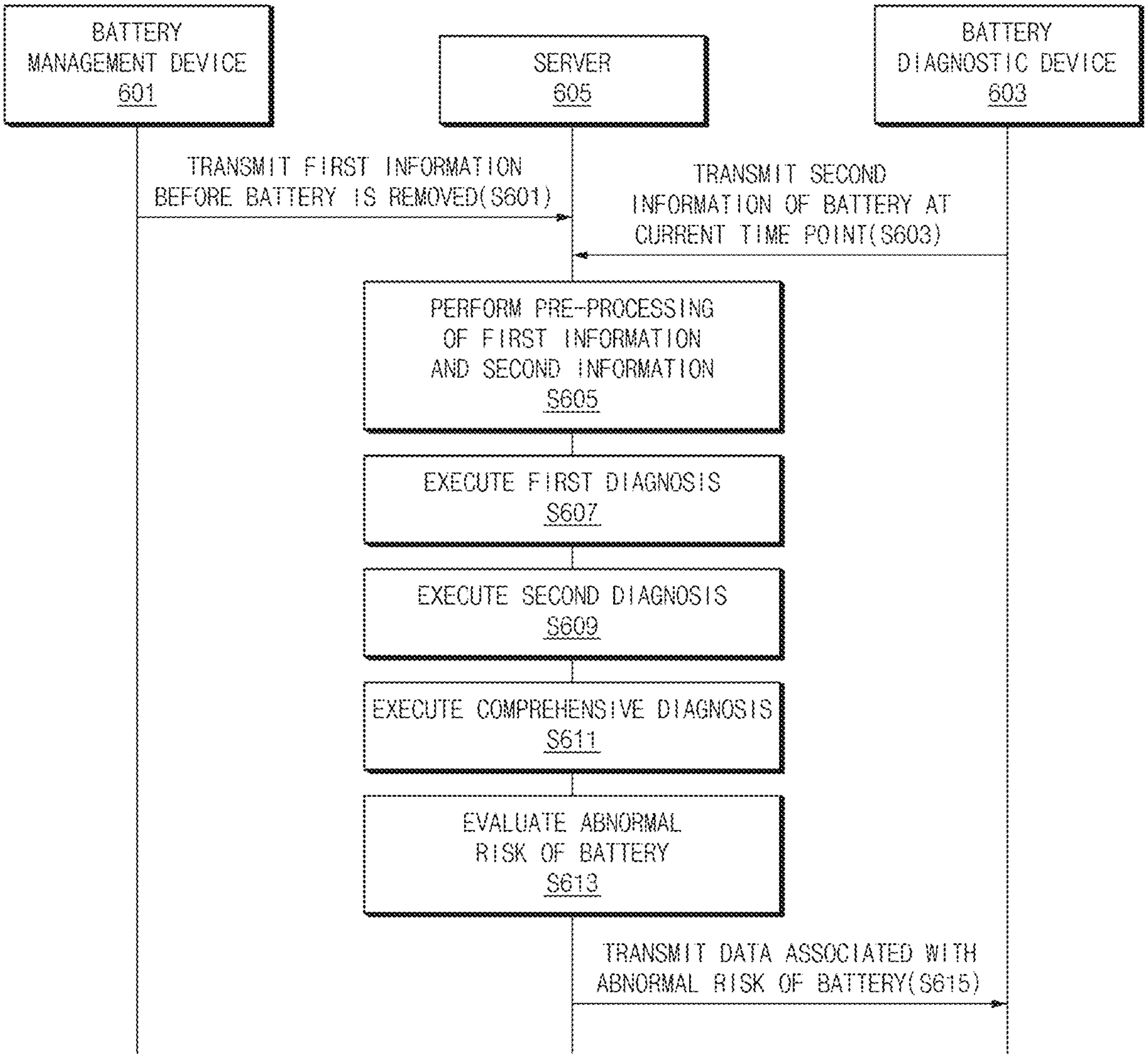
FIG. 6 illustrates an example of a signal sequence diagram associated with a battery diagnostic system, in an embodiment of the present disclosure.

FIG. 6 illustrates an example of a signal sequence diagram associated with a battery diagnostic system, in an embodiment of the present disclosure.

The respective operations of FIG. 6 may be sequentially performed, but are not necessarily sequentially performed. For example, an order of the respective operations may be changed, and at least two operations may be performed in parallel.

Referring to FIG. 6, in operation S601, in an embodiment, a battery management device 601 may transmit first information before a battery is removed to a server 605.

For example, the first information may include information associated with a voltage of at least one cell included in the battery and/or a time when the voltage of the at least one cell is measured at a time point before the battery is separated from a vehicle.

For example, the first information may include information associated with a voltage of the at least one cell at a past time point and/or a time when the voltage of the at least one cell at the past time point is measured.

In operation S603, in an embodiment, the battery diagnostic device 603 may transmit second information of the battery at a current time to the server 605.

For example, the second information may include information associated with a voltage of the at least one cell included in the battery after the battery is separated from the vehicle and/or a time when the voltage of the at least one cell is measured.

For example, the second information may include voltage information of the at least one cell at the current time point and/or time information at the current time point.

In operation S605, in an embodiment, the server 605 may perform pre-processing of the first information and the second information.

For example, the server 605 may convert voltage information at a past time point into an SOC. For example, the server 605 may convert voltage information at a current time point into an SOC. For example, the server 605 may obtain a difference between a time point when the first information is obtained and a time point when the second information is obtained.

In operation S607, in an embodiment, the server 605 may execute a first diagnosis.

For example, the first diagnosis may include a diagnosis of an amount of discharge current of the at least one cell. For example, the first diagnosis may include identifying whether a statistical value for the amount of discharge current of the at least one cell is out of a specified range, based on obtaining the statistical value. For example, the statistical value may be associated with the statistic described with reference to FIG. 1.

In operation S609, in an embodiment, the server 605 may execute a second diagnosis.

For example, the second diagnosis may include a diagnosis of a discharge rate of the at least one cell. For example, the second diagnosis may include identifying whether a statistical value for the discharge rate of the at least one cell is out of the specified range, based on obtaining the statistical value. For example, the statistical value may be associated with the statistic described with reference to FIG. 1.

In operation S611, in an embodiment, the server 605 may execute a comprehensive diagnosis.

For example, the comprehensive diagnosis may include identifying a state of the at least one cell, based on results of the first diagnosis and the second diagnosis.

In operation S613, in an embodiment, the server 605 may evaluate an abnormal risk of the battery. For example, evaluating the abnormal risk of the battery may include identifying a risk of the at least one cell included in the battery.

For example, the server 605 may identify an abnormal risk of the battery and/or an abnormal risk of the at least one cell, based on a first result of the first diagnosis and a second result of the second diagnosis.

For example, the server 605 may evaluate that the abnormal risk of the battery and/or the abnormal risk of the at least one cell are/is "low", based on that the first result and the second result are a normal state.

For example, the server 605 may evaluate that the abnormal risk of the battery and/or the abnormal risk of the at least one cell are/is "middle", based on that one of the first result or the second result is an abnormal state.

For example, the server 605 may evaluate that the abnormal risk of the battery and/or the abnormal risk of the at least one cell are/is "high", based on that the first result and the second result are the abnormal state.

In operation S615, in an embodiment, the server 605 may transmit data associated with the abnormal risk of the battery to the battery diagnostic device 603.

In an embodiment, the battery diagnostic device 603 may display a screen representing the abnormal risk of the battery, on a display, based on the data transmitted from the server 605.

As described above, in an embodiment, a battery diagnostic system may identify whether the at least one cell included in the battery is abnormal, based on data (or information) at a past time point and data (or information) at a current time point, thus diagnosing the battery at a relatively short time.

FIGS. 7A to 7D illustrate an example of a flowchart associated with a battery diagnostic method according to an embodiment of the present disclosure.

The respective operations of FIGS. 7A to 7D may be sequentially performed, but are not necessarily sequentially performed. For example, an order of the respective operations may be changed, and at least two operations may be performed in parallel.

Referring to FIGS. 7A to 7D, in operation S701, the battery diagnostic method according to an embodiment may include obtaining first information before a battery is removed.

For example, the battery diagnostic method may include obtaining the first information including a voltage of the battery and a voltage of at least one cell included in the battery, at a first time point before the battery is separated from a vehicle. For example, the first information may include time information about the first time point and voltage information associated with a voltage of the at least one cell, which is measured at the first time point.

In operation S703, the battery diagnostic method according to an embodiment may include obtaining second information of the battery at a current time point.

For example, the battery diagnostic method may include obtaining the second information including a voltage of the battery and a voltage of at least one cell included in the battery, at a second time point after the battery is separated from the vehicle. For example, the second information may include time information about the second time point and voltage information associated with a voltage of the at least one cell, which is measured at the second time point.

In operation S705, the battery diagnostic method according to an embodiment may perform pre-processing of the first information and the second information.

Operations S707 to S723, which can be described below, may include operations associated with the pre-processing of the first information and the second information.

In operation S707, the battery diagnostic method according to an embodiment may include obtaining a first cell voltage at a past time point.

For example, the battery diagnostic method may include obtaining the first cell voltage at a first time point corresponding to the past time point. For example, the past time point and/or the first time point may include a time point when a voltage is measured in a state the battery is mounted on the vehicle.

In operation S709, the battery diagnostic method according to an embodiment may include converting the first cell voltage into a first SOC.

For example, the battery diagnostic method may include converting the first cell voltage represented as an OCV into the first SOC, based on a table stored in a non-volatile memory.

In operation S711, the battery diagnostic method according to an embodiment may include obtaining a second cell voltage at a current time point.

For example, the battery diagnostic method may include obtaining the second cell voltage at a second time point corresponding to the current time point. For example, the current time point and/or the second time point may include a time point when a voltage is measured in a state the battery is separated from the vehicle.

In operation S713, the battery diagnostic method according to an embodiment may include converting the second cell voltage into a second SOC.

For example, the battery diagnostic method may include converting the second cell voltage represented as an OCV into the second SOC, based on the table stored in the non-volatile memory.

In operation S715, the battery diagnostic method according to embodiment may include calculating a difference between the first SOC and the second SOC.

In operation S717, the battery diagnostic method according to an embodiment may include obtaining a first time when the first cell voltage at the past time point is measured. For example, the first time may be referred to as the past time point and/or the first time point, which are/is described above.

In operation S719, the battery diagnostic method according to an embodiment may include obtaining a second time when the second cell voltage at the current time point is measured. For example, the second time may be referred to as the current time point and/or the second time point, which are/is described above.

In operation S721, the battery diagnostic method according to an embodiment may include calculating a difference between the first time the second time.

In operation S723, the battery diagnostic method according to an embodiment may include converting the difference between the first time the second time in units of specified duration.

For example, the units of the specified duration may include at least one of a minute, an hour, a day, or a month, or any combination thereof.

In operation S725, the battery diagnostic method according to an embodiment may include executing a first diagnosis.

Figure 7A:
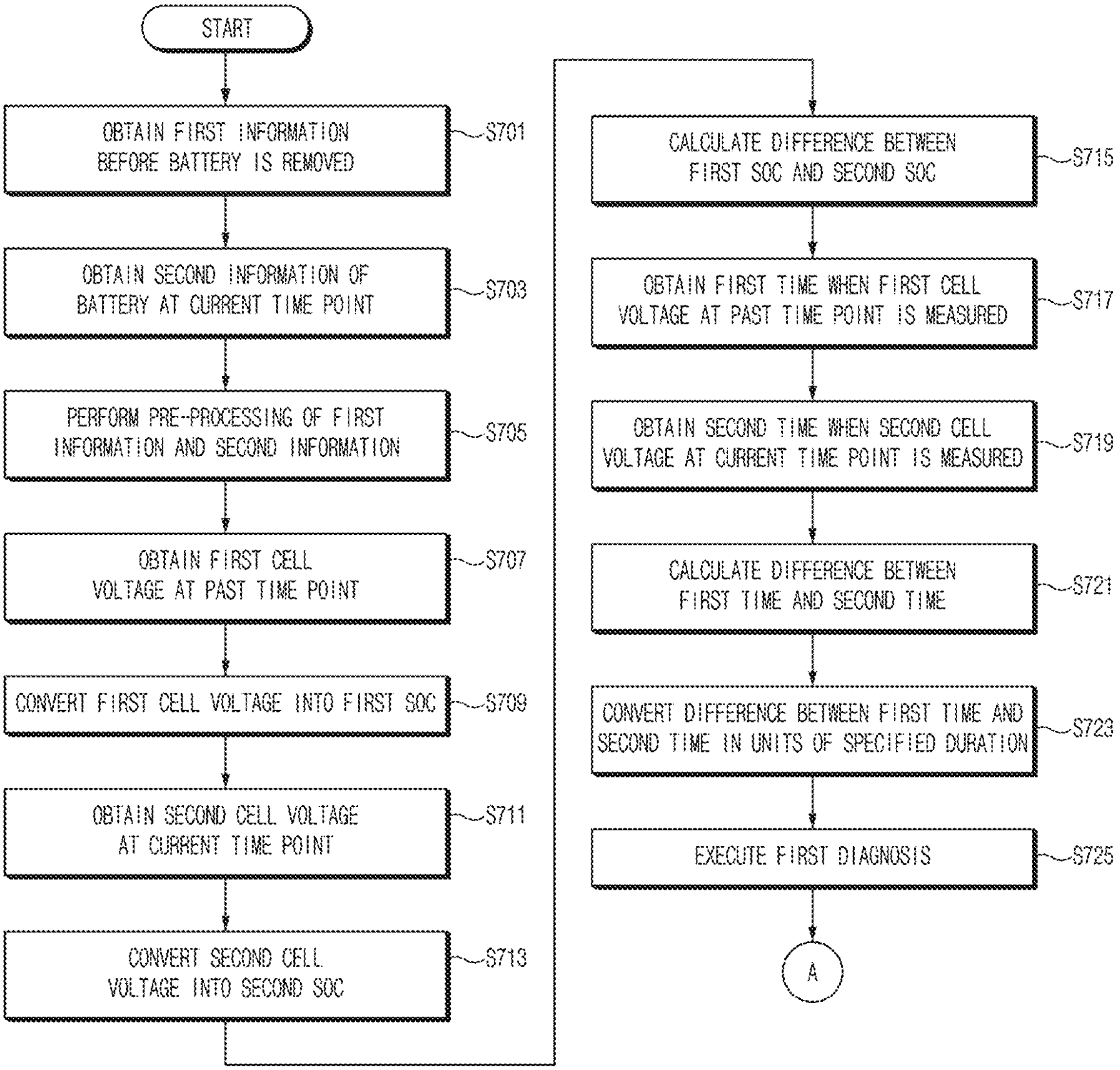
FIGS. 7A, 7B, 7C, and 7D illustrate an example of a flowchart associated with a battery diagnostic method according to an embodiment of the present disclosure.
Figure 7B:
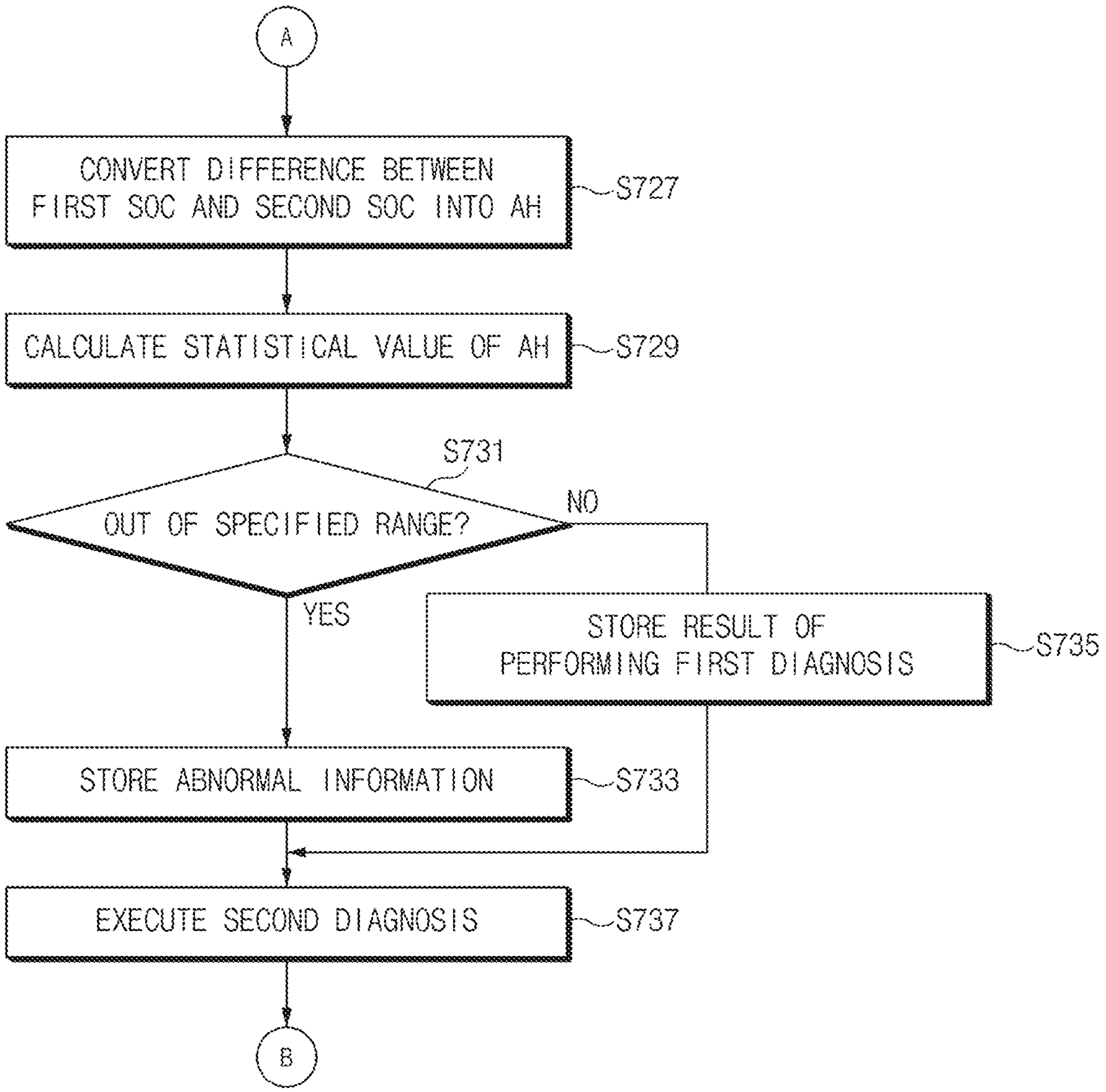

Referring to FIG. 7B, operations S727 to S737, which can be described below, may include operations associated with the first diagnosis.

In operation S727, the battery diagnostic method according to an embodiment may include converting the difference between the first SOC and the second SOC into an ampere-hour (Ah).

In operation S729, the battery diagnostic method according to an embodiment may include calculating a statistical value of the Ah.

For example, the statistical value may include the statistic described with reference to FIG. 1. For example, the statistical value of Ah may include a standard deviation of the Ah. For example, the Ah may include an amount of discharge current.

In operation S731, the battery diagnostic method according to an embodiment may include identifying whether the statistical value of the Ah is out of a specified range.

For example, the specified range may include 3-sigma based on the standard deviation.

When the statistical value of the Ah is out of the specified range (YES of operation S731), the battery diagnostic method according to an embodiment may include storing abnormal information.

When the statistical value of the Ah is not out of the specified range (NO of operation S731), in operation S735, the battery diagnostic method according to an embodiment may include storing the result of performing the first diagnosis.

For example, the battery diagnostic method may include storing normal information of the at least one cell, based on that the statistical value of the Ah is not out of the specified range.

The abnormal information based on the statistical value of the Ah and/or the normal information based on the statistical value of the Ah may be included in the result of the first diagnosis.

For example, the abnormal information based on the statistical value of the Ah may include the Ah, a cell number, an SOC star time, and/or an SOC end time.

In operation S737, the battery diagnostic method according to an embodiment may include executing a second diagnosis.

Figure 7C:
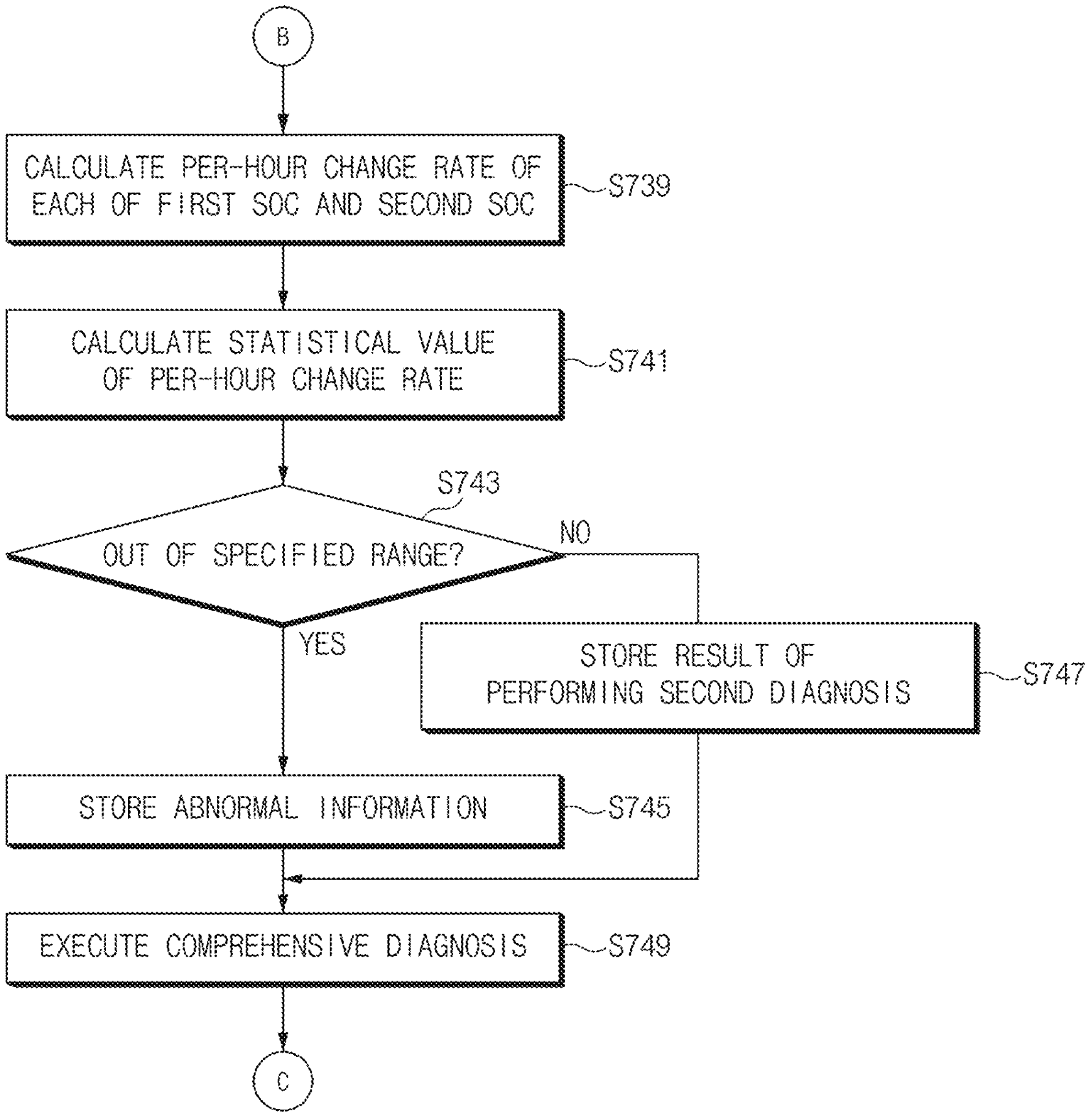

Referring to FIG. 7C, operations S739 to S749, which can be described below, may include operations associated with the second diagnosis.

In operation S739, the battery diagnostic method according to an embodiment may include calculating a per-hour change rate of each of the first SOC and the second SOC.

In operation S741, the battery diagnostic method according to an embodiment may include calculating a statistical value of the per-hour change rate of each of the first SOC and the second SOC.

For example, the statistical value may include the statistic described with reference to FIG. 1. For example, the statistical value of the per-hour change rate may include a standard deviation of the per-hour change rate.

In operation S743, the battery diagnostic method according to an embodiment may include identifying whether a statistical value of the per-hour change rate of each of the first SOC and the second SOC is out of the specified range.

For example, the specified range may include 3-sigma based on the standard deviation.

When the statistical value of the per-hour change rate of each of the first SOC and the second SOC is out of the specified range (YES of operation S743), in operation S745, the battery diagnostic method according to an embodiment may include storing abnormal information.

When the statistical value of the per-hour change rate of each of the first SOC and the second SOC is not out of the specified range (NO of operation S743), in operation S747, the battery diagnostic method according to an embodiment may include storing the result of performing the second diagnosis.

For example, the battery diagnostic method may include storing normal information of the at least one cell, based on that the statistical value of the per-hour change rate of each of the first SOC and the second SOC is not out of the specified range.

The abnormal information based on the per-hour change rate of each of the first SOC and the second SOC and the normal information based on the per-hour change rate of each of the first SOC and the second SOC may be included in the result of the second diagnosis.

For example, the abnormal information based on the per-hour change rate of each of the first SOC and the second SOC may include a per-hour change rate of an SOC, a cell number, an SOC start time, and/or an SOC end time.

In operation S749, the battery diagnostic method according to an embodiment may include executing a comprehensive diagnosis.

Figure 7D:
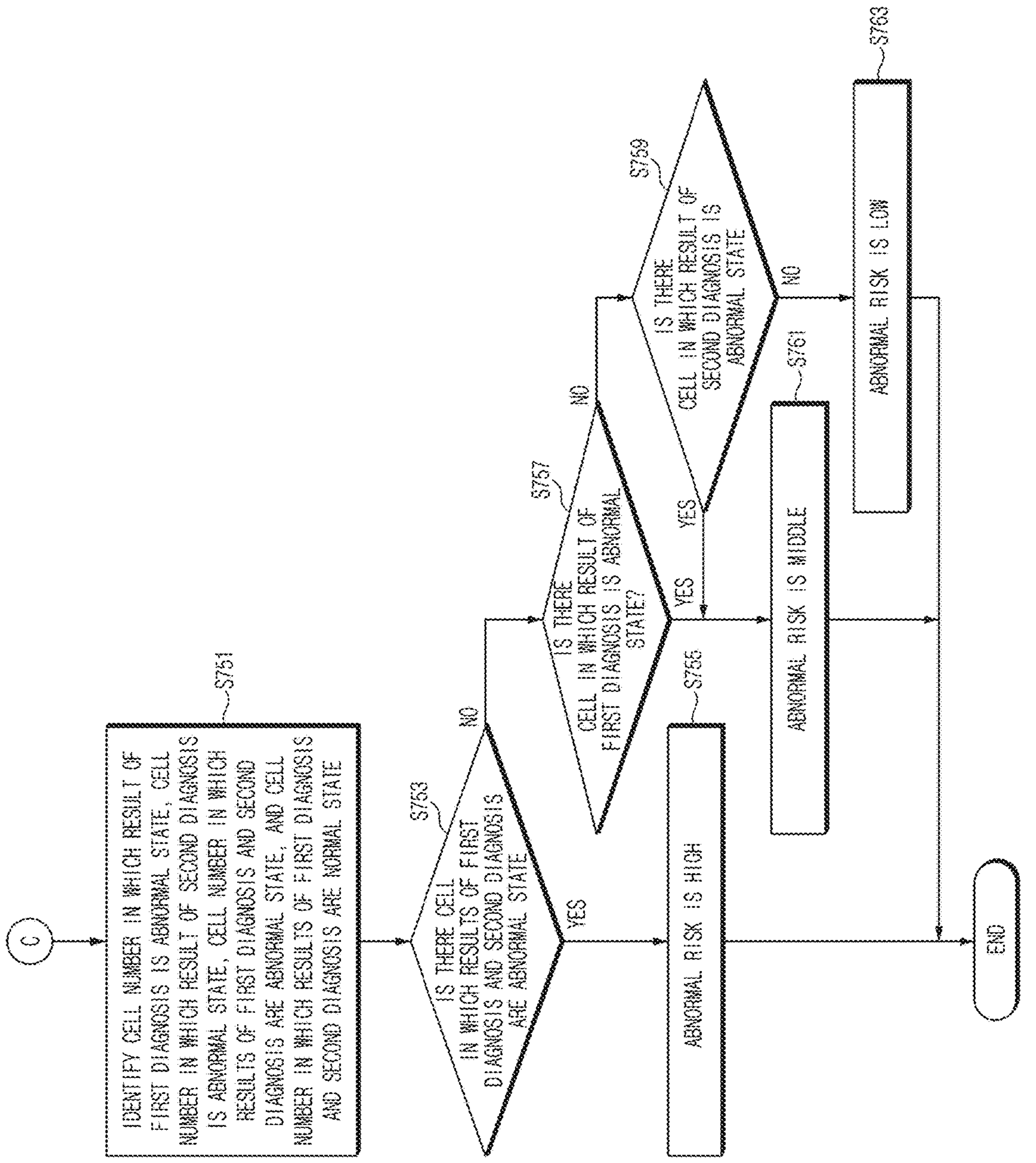

Referring to FIG. 7D, operations S751 to S763, which can be described below, may include operations associated with the comprehensive diagnosis.

In operation S751, the battery diagnostic method according to an embodiment may include identifying a cell number in which the result of the first diagnosis is an abnormal state, a cell number in which the result of the second diagnosis is an abnormal state, a cell number in which the results of the first diagnosis and the second diagnosis are the abnormal state, and a cell number in which the results of the first diagnosis and the second diagnosis are the normal state.

In operation S753, the battery diagnostic method according to an embodiment may include identifying whether there is a cell in which the results of the first diagnosis and the second diagnosis are the abnormal state.

When there is the cell in which the results of the first diagnosis and the second diagnosis are the abnormal state (YES of operation S753), in operation S755, the battery diagnostic method according to an embodiment may include identifying that an abnormal risk of the cell is "high".

When there is a cell in which the results of the first diagnosis and the second diagnosis are not the abnormal state (NO of operation S753), in operation S757, the battery diagnostic method according to an embodiment may include identifying whether there is a cell in which the result of the first diagnosis is the abnormal state.

When there is a cell in which the result of the first diagnosis is not the abnormal state (NO of operation S757), in operation S759, the battery diagnostic method according to an embodiment may include identifying whether there is a cell in which the result of the second diagnosis is the abnormal state.

When there is the cell in which the result of the first diagnosis is the abnormal state (YES of operation S757) or when there is the cell in which the result of the second diagnosis is the abnormal state (YES of operation S759), in operation S761, the battery diagnostic method according to an embodiment may include identifying that the abnormal risk of the cell is "middle".

For example, the battery diagnostic method may include identifying that the abnormal risk of the cell is "middle", based on that one of the result of the first diagnosis or the result of the second diagnosis is the abnormal state.

When there is no cell in which the result of the second diagnosis is the abnormal state (NO of operation S759), in operation S763, the battery diagnostic method according to an embodiment may include identifying that the abnormal risk of the cell is "low".

For example, the battery diagnostic method may include identifying that the abnormal risk of the cell is "low", based on that the result of the first diagnosis and the result of the second diagnosis are the normal state.

FIG. 8 illustrates an example of a battery diagnostic system in which various pieces of hardware and/or software are used according to conditions, in an embodiment of the present disclosure.

Referring to FIG. 8, cases may be divided into first to ninth cases, based on first to eighth conditions. Pieces of different hardware and/or pieces of different software may be used according to the respective cases.

For example, the first condition may be associated with whether it is possible to extract battery management unit (BMU) data using a diagnoser (e.g., a battery diagnostic device).

For example, the second condition may be associated with whether there is a connected car service (CCS) subscriber.

For example, the third condition may be associated with whether past data collection is normal among CCS subscribers.

For example, the fourth condition may be associated with whether it is possible to identify a unique number of a battery system assembly (BSA) after the battery is removed.

For example, the fifth condition may be associated with whether it is possible to communicate with a global diagnostic system (GDS) and a CCS server.

For example, the sixth condition may be associated with whether it is possible to use a cloud server.

For example, the seventh condition may be associated with whether it is possible to use an application.

For example, the eighth condition may be associated with whether it is possible to use a web server user interface (UI).

The cases may be divided into different cases depending on whether each of the first to eighth conditions is met, and hardware and/or software used in each case may vary with whether each of the first to eighth conditions is met.

For example, in the first case meeting all the first to eighth conditions, a data providing entity may include a battery management device. For example, in the first case, a data calculation entity may include a server. For example, in the first case, a data display entity may include a battery diagnostic device, an application, and/or a web server user interface.

For example, in the first case, a battery diagnosis may be performed by the battery management device, the battery diagnostic device, and the server.

For example, in the first case, a battery diagnosis may be performed by the battery management device, the server, and the application.

For example, in the first case, a battery diagnosis may be performed by the battery management device, the server, and the web server user interface.

For example, in the second case meeting the first to seventh conditions among the first to eighth conditions, the data providing entity may include the battery management device. For example, in the second case, the data calculation entity may include the server. For example, in the second case, the data display entity may include the battery diagnostic device and/or the application.

For example, in the second case, a battery diagnosis may be performed by the battery management device, the battery diagnostic device, and the server.

For example, in the second case, a battery diagnosis may be performed by the battery management device, the battery diagnostic device, and the application.

For example, in the third case meeting the first to sixth conditions among the first to eighth conditions, the data providing entity may include the battery management device. In the third case, the data calculation entity may include the server and/or the battery diagnostic device. In the third case, the data display entity may include the battery diagnostic device.

For example, in the third case, a battery diagnosis may be performed by the battery management device, the battery diagnostic device, and the server.

For example, in the third case, a battery diagnosis may be performed by the battery management device and the battery diagnostic device.

For example, in the fourth case meeting the first to fifth conditions among the first to eighth conditions, the data providing entity may include the battery management device. For example, in the fourth case, the data calculation entity may include the battery diagnostic device and/or the server. For example, in the fourth case, the data display entity may include the battery diagnostic device.

For example, in the fourth case, a battery diagnosis may be performed by the battery management device, the battery diagnostic device, and the server.

For example, in the fourth case, a battery diagnosis may be performed by the battery management device and the battery diagnostic device.

For example, in the fifth case meeting the first to fourth conditions among the first to eighth conditions, the data providing entity may include the battery management device. For example, in the fifth case, the data calculation entity may include the battery diagnostic device. For example, in the fifth case, the data display entity may include the battery diagnostic device.

For example, in the fifth case, a battery diagnosis may be performed by the battery management device and the battery diagnostic device.

For example, in the sixth case meeting the first to third conditions among the first to eighth conditions, the data providing entity may include the battery management device. For example, in the sixth case, the data calculation entity may include the battery diagnostic device. For example, in the sixth case, the data display entity may include the battery diagnostic device.

For example, in the sixth case, a battery diagnosis may be performed by the battery management device and the battery diagnostic device.

For example, in the seventh case meeting the first and second conditions among the first to eighth conditions, the data providing entity may include the battery management device. For example, in the seventh case, the data calculation entity may include the battery diagnostic device. For example, in the seventh case, the data display entity may include the battery diagnostic device.

For example, in the seventh case, a battery diagnosis may be performed by the battery management device and the battery diagnostic device.

For example, in the eighth case meeting the first condition among the first to eighth conditions, the data providing entity may include the battery management device. For example, in the eighth case, the data calculation entity may include the battery diagnostic device. For example, in the eighth case, the data display entity may include the battery diagnostic device.

For example, in the eighth case, a battery diagnosis may be performed by the battery management device and the battery diagnostic device.

For example, in the ninth case which does not meet the first to eighth conditions, the data providing entity may include the battery management device and/or the battery diagnostic device. For example, in the ninth case, the data calculation entity may include the battery management device. For example, in the ninth case, the data display entity may include the battery diagnostic device.

For example, in the ninth case, a battery diagnosis may be performed by the battery management device and the battery diagnostic device.

Figure 9:
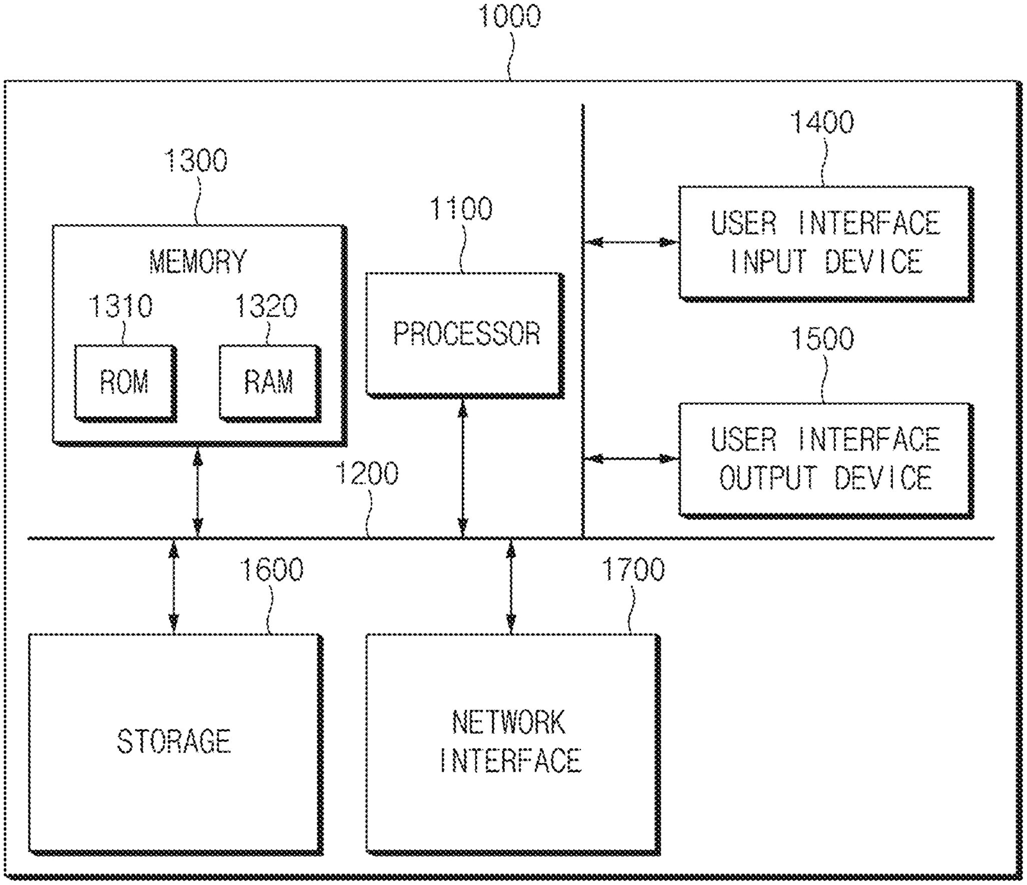
FIG. 9 illustrates a computing system associated with a battery diagnostic device or a battery diagnostic method according to an embodiment of the present disclosure.

FIG. 9 illustrates a computing system associated with a battery diagnostic device or a battery diagnostic method according to an embodiment of the present disclosure.

Referring to FIG. 9, a computing system 1000 may include at least one processor 1100, a memory 1300, a user interface input device 1400, a user interface output device 1500, storage 1600, and a network interface 1700, which are connected with each other via a bus 1200, any combination of or all of which may be in plural or may include plural components thereof.

The processor 1100 may be a central processing unit (CPU) or a semiconductor device that processes instructions stored in the memory 1300 and/or the storage 1600. The memory 1300 and the storage 1600 may include various types of volatile or non-volatile storage media. For example, the memory 1300 may include a read only memory (ROM) 1310 and a random access memory (RAM) 1320.

Accordingly, the operations of the method or algorithm described in connection with the embodiments disclosed in the specification may be directly implemented with a hardware module, a software module, or a combination of the hardware module and the software module, which is executed by the processor 1100. The software module may reside on a storage medium (that is, the memory 1300 and/or the storage 1600) such as a RAM, a flash memory, a ROM, an EPROM, an EEPROM, a register, a hard disc, a removable disk, and a CD-ROM.

The example storage medium may be coupled to the processor 1100. The processor 1100 may read out information from the storage medium and may write information in the storage medium. Alternatively, the storage medium may be integrated with the processor 1100. The processor and the storage medium may reside in an application specific integrated circuit (ASIC). The ASIC may reside within a user terminal. In another case, the processor and the storage medium may reside in the user terminal as separate components.

The present technology may identify whether the battery removed from the vehicle is abnormal.

Furthermore, the present technology may identify whether the battery is abnormal by using information at a past time point and information at a current time point.

Furthermore, the present technology may identify whether the battery is abnormal in a relatively short time by identifying whether the battery is abnormal based on the information at the past time point and the information at the current time point.

In addition, various effects ascertained directly or indirectly through the present disclosure may be provided.

Hereinabove, although the present disclosure has been described with reference to example embodiments and the accompanying drawings, the present disclosure is not necessarily limited thereto, but may be variously modified and altered by those skilled in the art to which the present disclosure pertains without departing from the spirit and scope of the present disclosure claimed in the following claims.

Therefore, example embodiments of the present disclosure are not intended to limit the technical spirit of the present disclosure, but are provided for illustrative purposes. The scope of the present disclosure can be construed on the basis of the accompanying claims, and technical ideas within a scope equivalent to the claims can be included in the scope of the present disclosure.

What is claimed is:

1. A battery diagnostic device, comprising:
- a battery including at least one cell;
- one or more processors; and
- a non-transitory storage medium storing computer-readable instructions that, when executed by the one or more processors, enable the one or more processors to:
  - store voltages of the at least one cell, the voltages being obtained at a plurality of time points, and pieces of information associated with times when the battery is driven, the pieces of information being obtained at the plurality of time points, in the storage medium,
  - obtain states of charge (SOCs) corresponding to the voltages of the at least one cell, based on converting the voltages of the at least one cell, the voltages being obtained at the plurality of time points,
  - identify an amount of discharge current of the at least one cell and a discharge rate of the at least one cell, based on obtaining the SOCs of the at least one cell, wherein the instructions for the obtaining of the SOCs and the identifying the amount of discharge current of the at least one cell and the discharge rate of the at least one cell further enable the one or more processors to:
    - identify a first SOC by a first voltage of the at least one cell, the first voltage being measured at a first time point,
    - identify a second SOC by a second voltage of the at least one cell, the second voltage being measured at a second time point subsequent to the first time point,
    - identify a first difference between the first time point and the second time point,
    - identify a second difference between the first SOC and the second SOC,
    - convert the first difference and the second difference in units of a specified duration, and
    - identify the amount of discharge current of the at least one cell and the discharge rate of the at least one cell, based on the first difference converted in units of the specified duration and the second difference converted in units of the specified duration,
  - identify a state of the at least one cell, based on the amount of discharge current and the discharge rate, and
  - store the state of the at least one cell in the storage medium.

2. The device of claim 1, wherein the instructions further enable the one or more processors to convert the voltages of the at least one cell based on an open circuit voltage (OCV) into the SOCs, based on a table stored in the storage medium.

3. The device of claim 1, wherein the instructions further enable the one or more processors to:
- obtain a first statistical value for the amount of discharge current of the at least one cell;
- obtain a second statistical value for the discharge rate of the at least one cell;
- obtain a specified range, based on the first statistical value and the second statistical value; and
- identify the state of the at least one cell, based on the first statistical value, the second statistical value, and the specified range.

4. The device of claim 3, wherein the instructions further enable the one or more processors to:
- identify that the state of the at least one cell is a normal state, based on that the first statistical value and the second statistical value are within the specified range; and
- identify that the state of the at least one cell is an abnormal state, based on that at least one of the first statistical value or the second statistical value is out of the specified range.

5. The device of claim 3, wherein the instructions further enable the one or more processors to:

identify a risk of the at least one cell, based on that the state of the at least one cell is an abnormal state;

identify that the risk is a first level, based on that one of the first statistical value or the second statistical value is out of the specified range obtained by the first statistical value and the second statistical value; and identify that the risk is a second level higher than the first level, based on that the first statistical value and the second statistical value are out of the specified range.

6. The device of claim 1, wherein the instructions further enable the one or more processors to:

identify a third time point when the battery is ignition (Ig) on;

identify a fifth time point for which a specified duration elapses from a fourth time point at which the battery is Ig off; and identify a driven time for which the battery is driven, based on the third time point and the fifth time point.

7. The device of claim 1, wherein the instructions further enable the one or more processors to:

display a screen indicating the state of the at least one cell on a display included in one of or both of the battery diagnostic device and a portable device; or cause an external electronic device to display the state of the at least one cell, based on transmitting information indicating the state of the at least one cell to the external electronic device through a communication circuit.

8. The device of claim 1, wherein the one or more processors being included in at least one of or any combination of a battery management unit (BMU), a battery management system (BMS), and a server.

9. A battery diagnostic method, comprising:

storing voltages of at least one cell, the voltages being obtained at a plurality of time points, and pieces of information associated with times when a battery is driven, the pieces of information being obtained at the plurality of time points;

obtaining states of charge (SOCs) corresponding to the voltages of the at least one cell, based on converting the voltages of the at least one cell, the voltages being obtained at the plurality of time points, wherein the obtaining the SOCs comprises:

identifying a first SOC by a first voltage of the at least one cell, the first voltage being measured at a first time point, and identifying a second SOC by a second voltage of the at least one cell, the second voltage being measured at a second time point subsequent to the first time point;

identifying an amount of discharge current of the at least one cell and a discharge rate of the at least one cell, based on obtaining the SOCs of the at least one cell, wherein the identifying the amount of discharge current of the at least one cell and the discharge rate of the at least one cell comprises:

identifying a first difference between the first time point and the second time point, identifying a second difference between the first SOC and the second SOC, converting the first difference and the second difference in units of a specified duration, and identifying the amount of discharge current of the at least one cell and the discharge rate of the at least one cell, based on the first difference converted in units of the specified duration and the second difference converted in units of the specified duration;

identifying a state of the at least one cell, based on the amount of discharge current and the discharge rate; and storing the state of the at least one cell.

10. The method of claim 9, further comprising converting the voltages of the at least one cell based on an open circuit voltage (OCV) into the SOCs, based on a stored table.

11. The method of claim 9, further comprising:

obtaining a first statistical value for the amount of discharge current of the at least one cell;

obtaining a second statistical value for the discharge rate of the at least one cell;

obtaining a specified range, based on the first statistical value and the second statistical value; and identifying the state of the at least one cell, based on the first statistical value, the second statistical value, and the specified range.

12. The method of claim 11, further comprising:

identifying that the state of the at least one cell is a normal state, based on that the first statistical value and the second statistical value are within the specified range; and identifying that the state of the at least one cell is an abnormal state, based on that at least one of the first statistical value or the second statistical value is out of the specified range.

13. The method of claim 11, further comprising:

identifying a risk of the at least one cell, based on that the state of the at least one cell is an abnormal state;

identifying that the risk is a first level, based on that one of the first statistical value or the second statistical value is out of the specified range obtained by the first statistical value and the second statistical value; and identifying that the risk is a second level higher than the first level, based on that the first statistical value and the second statistical value are out of the specified range.

14. The method of claim 9, further comprising:

identifying a third time point when the battery is ignition (Ig) on;

identifying a fifth time point in which a specified duration elapses from a fourth time point when the battery is Ig off; and identifying a time when the battery is driven, based on the third time point and the fifth time point.

15. The method of claim 9, further comprising:

displaying a screen indicating the state of the at least one cell on a display included in one of or both of a battery diagnostic device and a portable device; or causing an external electronic device to display the state of the at least one cell, based on transmitting information indicating the state of the at least one cell to the external electronic device through a communication circuit.

16. The method of claim 9, wherein the method is performed on one or more processors included in at least one of or any combination of a battery management unit (BMU), a battery management system (BMS), and a server.

17. A battery diagnostic method, comprising:

identifying a first SOC by a first voltage of at least one cell of a vehicle battery, the first voltage being measured at a first time point;

identifying a second SOC by a second voltage of the at least one cell, the second voltage being measured at a second time point subsequent to the first time point;

identifying a first difference between the first time point and the second time point;

identifying a second difference between the first SOC and the second SOC;

converting the first difference and the second difference in units of a specified duration;

identifying an amount of discharge current of the at least one cell and a discharge rate of the at least one cell, based on the first difference converted in units of the specified duration and the second difference converted in units of the specified duration;

identifying a state of the at least one cell, based on the amount of discharge current and the discharge rate; and storing the state of the at least one cell.

18. The method of claim 17, wherein the first time point is before the vehicle battery is removed from the vehicle or before the vehicle battery is separated from the vehicle, and wherein the second time point is after the vehicle battery is separated from the vehicle.

19. The method of claim 17, wherein the identifying of the first SOC comprises converting the first voltage being a first open circuit voltage of the at least one cell into the first SOC based on a stored table, and wherein the identifying of the second SOC comprises converting the second voltage being a second open circuit voltage of the at least one cell into the second SOC based on the stored table.

20. The method of claim 17, further comprising:

obtaining a first statistical value for the amount of discharge current of the at least one cell;

obtaining a second statistical value for the discharge rate of the at least one cell;

obtaining a specified range, based on the first statistical value and the second statistical value; and identifying the state of the at least one cell, based on the first statistical value, the second statistical value, and the specified range.

* * * * *